United States Patent
Ranganathan et al.

(10) Patent No.: US 7,644,148 B2
(45) Date of Patent: Jan. 5, 2010

(54) HISTORICAL DATA BASED WORKLOAD ALLOCATION

(75) Inventors: Parthasarathy Ranganathan, Fremont, CA (US); Keith Farkas, San Carlos, CA (US); Justin Moore, Durham, NC (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 807 days.

(21) Appl. No.: 11/129,986

(22) Filed: May 16, 2005

(65) Prior Publication Data

US 2006/0259621 A1 Nov. 16, 2006

(51) Int. Cl.
G06F 15/173 (2006.01)
G06F 1/00 (2006.01)
G06F 9/46 (2006.01)

(52) U.S. Cl. .................. 709/223; 709/226; 713/300; 718/102; 718/104; 718/105

(58) Field of Classification Search .......... 709/224, 709/223, 226; 713/300; 718/102, 104, 105
See application file for complete search history.

(56) References Cited

U.S. PATENT DOCUMENTS

| | | | | |
|---|---|---|---|---|
| 6,104,003 A * | 8/2000 | Jones | ..................... | 219/400 |
| 6,374,627 B1 * | 4/2002 | Schumacher et al. | ........ | 62/259.2 |
| 6,415,617 B1 * | 7/2002 | Seem | ................. | 62/186 |
| 6,795,928 B2 * | 9/2004 | Bradley et al. | ............... | 713/320 |
| 6,889,908 B2 * | 5/2005 | Crippen et al. | ............ | 236/49.3 |
| 2002/0004915 A1 * | 1/2002 | Fung | ................. | 713/320 |
| 2002/0062454 A1 * | 5/2002 | Fung | ................. | 713/300 |
| 2003/0182249 A1 * | 9/2003 | Buczak | .............. | 706/15 |
| 2004/0228087 A1 * | 11/2004 | Coglitore | ................. | 361/687 |
| 2004/0262409 A1 * | 12/2004 | Crippen et al. | ............ | 236/49.3 |
| 2005/0108582 A1 * | 5/2005 | Fung | ................. | 713/300 |
| 2006/0047808 A1 * | 3/2006 | Sharma et al. | ............ | 709/224 |
| 2006/0225446 A1 * | 10/2006 | Bash et al. | ................. | 62/178 |
| 2006/0248359 A1 * | 11/2006 | Fung | ................. | 713/300 |
| 2006/0248360 A1 * | 11/2006 | Fung | ................. | 713/300 |
| 2006/0248361 A1 * | 11/2006 | Fung | ................. | 713/300 |
| 2007/0089446 A1 * | 4/2007 | Larson et al. | ............ | 62/259.2 |
| 2009/0144568 A1 * | 6/2009 | Fung | ................. | 713/300 |

OTHER PUBLICATIONS

Moore, J. et al., "Going Beyond CPUs: The Potential for Temperature-Aware Data Centers", Powerpoint, Hewlett-Packard Development Co., L.P., Jun. 30, 2004.

Moore, J. et al., "Going Beyond CPUs: The Potential for Temperature-Aware Data Center", Hewlett-Packard Labs, downloaded May 16, 2005.

* cited by examiner

*Primary Examiner*—Ario Etienne
*Assistant Examiner*—Sargon N Nano

(57) ABSTRACT

In a method of allocating workload among servers based upon historical data, a requested workload profile is received and is compared with a plurality of historical workload profiles. A historical workload profile that is within a predefined range of the requested workload profile and that corresponds to a substantially minimized resource usage for power and cooling is selected. In addition, workload among the servers is allocated according to the selected historical workload profile to thereby substantially minimize resource usage for power and cooling.

22 Claims, 8 Drawing Sheets

HISTORICAL DATA BASED WORKLOAD ALLOCATION

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system containing multiple microprocessors dissipates approximately 250 W of power. Thus, a rack containing forty (40) computer systems of this type dissipates approximately 10 KW of power.

Current approaches to provisioning cooling to dissipate the heat generated by the cooling systems are typically based on using energy balance to size the air conditioning units and intuition to design air distributions in the data center. In many instances, the provisioning of the cooling is based on the nameplate power ratings of all of the servers in the data center, with some slack for risk tolerance. This type of cooling provisioning oftentimes leads to excessive and inefficient cooling solutions. This problem is further exacerbated by the fact that in most data centers, the cooling is provisioned for worst-case or peak load scenarios. Since it is estimated that typical data center operations only utilize a fraction of the servers, provisioning for these types of scenarios often increases the inefficiencies found in conventional cooling arrangements.

As such, it would be beneficial to have simple, yet effective thermal management that does not suffer from the inefficiencies found in conventional data center cooling arrangements.

SUMMARY OF THE INVENTION

A method of allocating workload among servers based upon historical data is disclosed herein. In the method, a requested workload profile is received and is compared with a plurality of historical workload profiles. A historical workload profile that is within a predefined range of the requested workload profile and that corresponds to a substantially minimized resource usage for power and cooling is selected. In addition, workload among the servers is allocated according to the selected historical workload profile to thereby substantially minimize resource usage for power and cooling.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

As described herein below, historical data pertaining to prior data center behavior for a relatively wide range of historical workload profiles is employed in distributing workload among servers. More particularly, the historical data is employed to determine the historical workload profile, including the workload placement arrangement of the servers, that requires the least amount of energy to perform a requested workload. In making this determination, a comparison of the historical workload profiles with requested workload profiles is made.

Figure 1A:
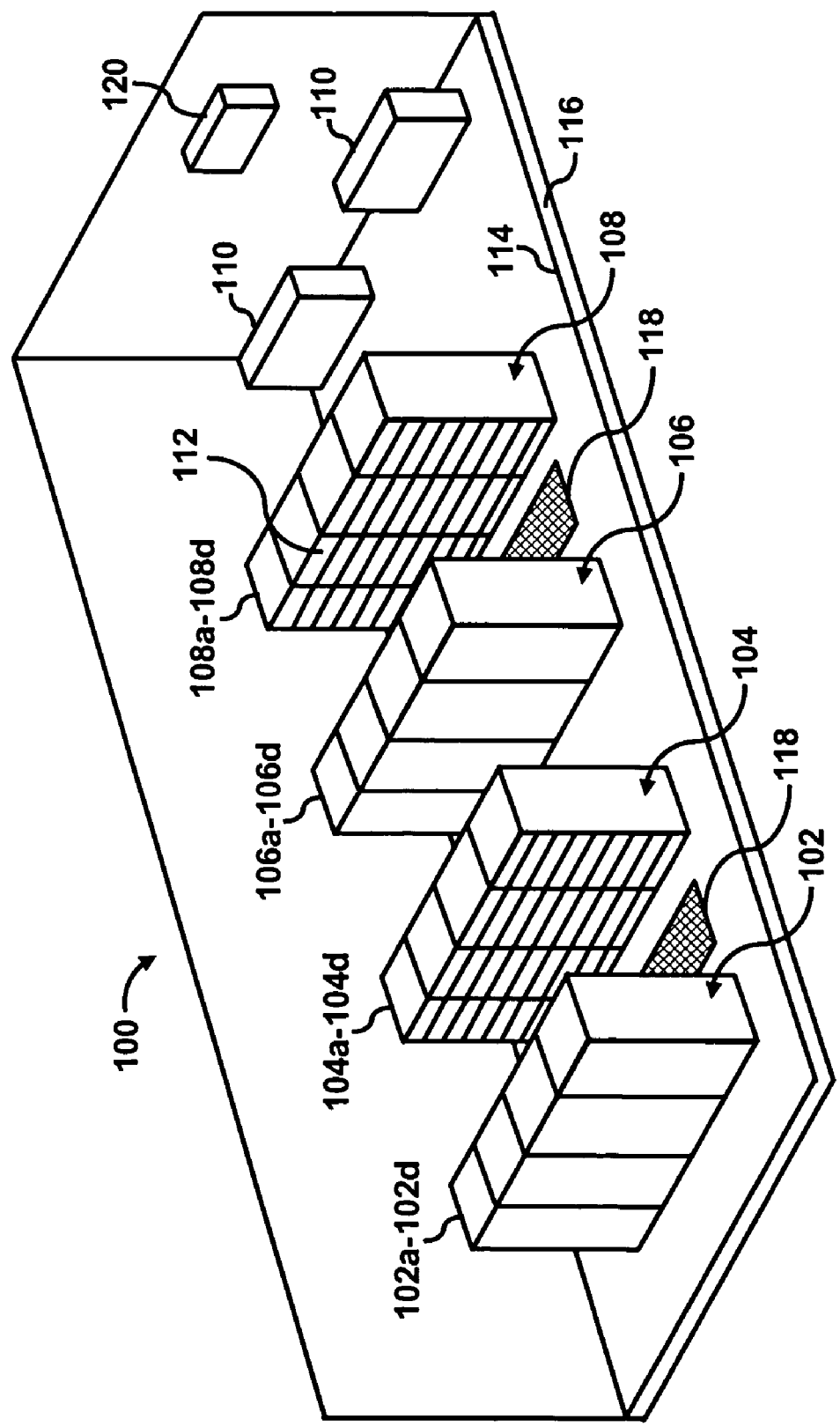
FIG. 1A shows a simplified perspective view of a data center, according to an embodiment of the invention.

With reference first to FIG. 1A, there is shown a simplified perspective view of a data center 100. The terms "data center" are generally meant to denote a room or other space and are not meant to limit the invention to any specific type of room where data is communicated or processed, nor should it be construed that use of the terms "data center" limits the invention in any respect other than its definition hereinabove. The terms "data center" as referenced throughout the present disclosure may also denote any physically collocated collection of computing equipment, such as, for instance, computing equipment contained in a single rack, a cluster of racks, etc. In addition, although particular reference is made throughout to CRAC units, various other types of air conditioning units may be employed. For instance, if the "data center" as referenced herein comprises a rack of computing equipment, the CRAC units may comprise, for instance, server air conditioning units, fans and cooling systems specific to the rack, etc.

The data center 100 depicted in FIG. 1A represents a generalized illustration and other components may be added or existing components may be removed or modified without departing from a scope of the data center 100. For example, the data center 100 may include any number of racks and various other apparatuses known to be housed in data centers. Thus, although the data center 100 is illustrated as containing four rows of racks 102-108 and two computer room air conditioning (CRAC) units 110, it should be understood that the data center 100 may include any number of racks, for instance, 100 racks, and CRAC units 110.

The data center 100 is depicted as having a plurality of racks 102-108, for instance, electronics cabinets, aligned in substantially parallel rows. The racks 102-108 are illustrated as housing a number of components 112, which may comprise, for instance, computers, servers, monitors, hard drives, disk drives, etc., designed to perform various operations, for instance, computing, switching, routing, displaying, etc. These components 112 may comprise subsystems (not shown), for example, processors, micro-controllers, high-speed video cards, memories, semi-conductor devices, and the like to perform these functions. In the performance of these electronic functions, the subsystems and therefore the components 112, generally dissipate relatively large amounts of heat.

A relatively small number of components 112 are illustrated as being housed in the racks 102-108 for purposes of simplicity. It should, however, be understood that the racks 102-108 may include any number of components 112, for instance, forty or more components 112, or 200 or more blade systems. In addition, although the racks 102-108 are illustrated as containing components 112 throughout the heights of the racks 102-108, it should be understood that some of the racks 102-108 may include slots or areas that do not include components 112 without departing from the scope of the racks 102-108.

The rows of racks 102-108 are shown as containing four racks (a-d) positioned on a raised floor 1114. A plurality of wires and communication lines (not shown) may be located in a space 116 beneath the raised floor 114. The space 116 may also function as a plenum for delivery of cooling airflow from the CRAC units 110 to the racks 102-108. The cooled airflow may be delivered from the space 116 to the racks 102-108 through a plurality of vent tiles 118 located between some or all of the racks 102-108. The vent tiles 118 are shown in FIG. 1A as being located between racks 102 and 104 and 106 and 108. One or more temperature sensors (not shown) may also be positioned in the space 116 to detect the temperatures of the airflow supplied by the CRAC units 110.

The CRAC units 110 generally operate to receive heated airflow from the data center 100, cool the heated airflow, and to deliver the cooled airflow into the plenum 116. The CRAC units 110 may comprise vapor-compression type air conditioning units, water-chiller type air conditioning units, etc. In one regard, the CRAC units 110 may operate in manners generally consistent with conventional CRAC units 110. Alternatively, the CRAC units 110 and the vent tiles 118 may be operated to vary characteristics of the cooled airflow delivery as described, for instance, in commonly assigned U.S. Pat. No. 6,574,104, filed on Oct. 5, 2001, which is hereby incorporated by reference in its entirety.

Also shown in the data center 100 is a resource manager 120. Although the resource manager 120 is depicted as an individual computing device, the resource manager 120 may comprise a server or other computing device housed in one of the racks 102-108, without departing from a scope of the resource manager 120. In addition, if the resource manager 120 is comprised in a server or other computing device, the resource manager 120 may be implemented on the local application scheduler level, the operating system, virtual machine scheduler, hardware, etc. In any regard, the resource manager 120 is generally configured to control various operations in the data center 100. For instance, the resource manager 120 may be configured to control workload placement among the various components 112.

As described in greater detail herein below, the resource manager 120 may be configured to create a repository of data center 100 behavior at various data center 100 settings. The data center 100 settings may include, for instance, the type of workload, the central processing unit (CPU) utilization, the memory utilization, the network utilization, the storage utilization, the temperature at the inlets of the components 112, the temperatures at the outlets of the components 112, and the total power consumption level a the utilization and temperature levels. In addition, the resource manager 120 is configured to control workload placement among the various components 112 based upon a comparison of an input profile and the profiles contained in the repository. That is, the resource manager 120 may determine which of the profiles contained in the repository yields the lowest costs in cooling the components 112 in the data center 100.

The CRAC units 110 may include sensors (not shown) configured to detect at least one environmental condition, for instance, temperature, pressure, humidity, etc. These sensors may comprise any reasonably suitable conventional sensors configured to detect one or more of these environmental conditions and may comprise devices separate from the CRAC units 110 or they may comprise devices integrated with the CRAC units 110. The sensors may be positioned, for instance, to detect the temperature of the airflow returned into the CRAC units 110. The measurements obtained by the sensors may be employed in controlling operations of the CRAC units 110, such as, the temperature of the airflow supplied and the volume flow rate at which the airflow is supplied. The levels of these operations by the CRAC units 110 generally relate to the amount of power consumed in cooling the components 112. Therefore, reducing operations of the CRAC units 110, that is, one or both of decreasing volume flow rate and increasing temperature, generally results in a reduction in the power consumption level.

Figure 1B:
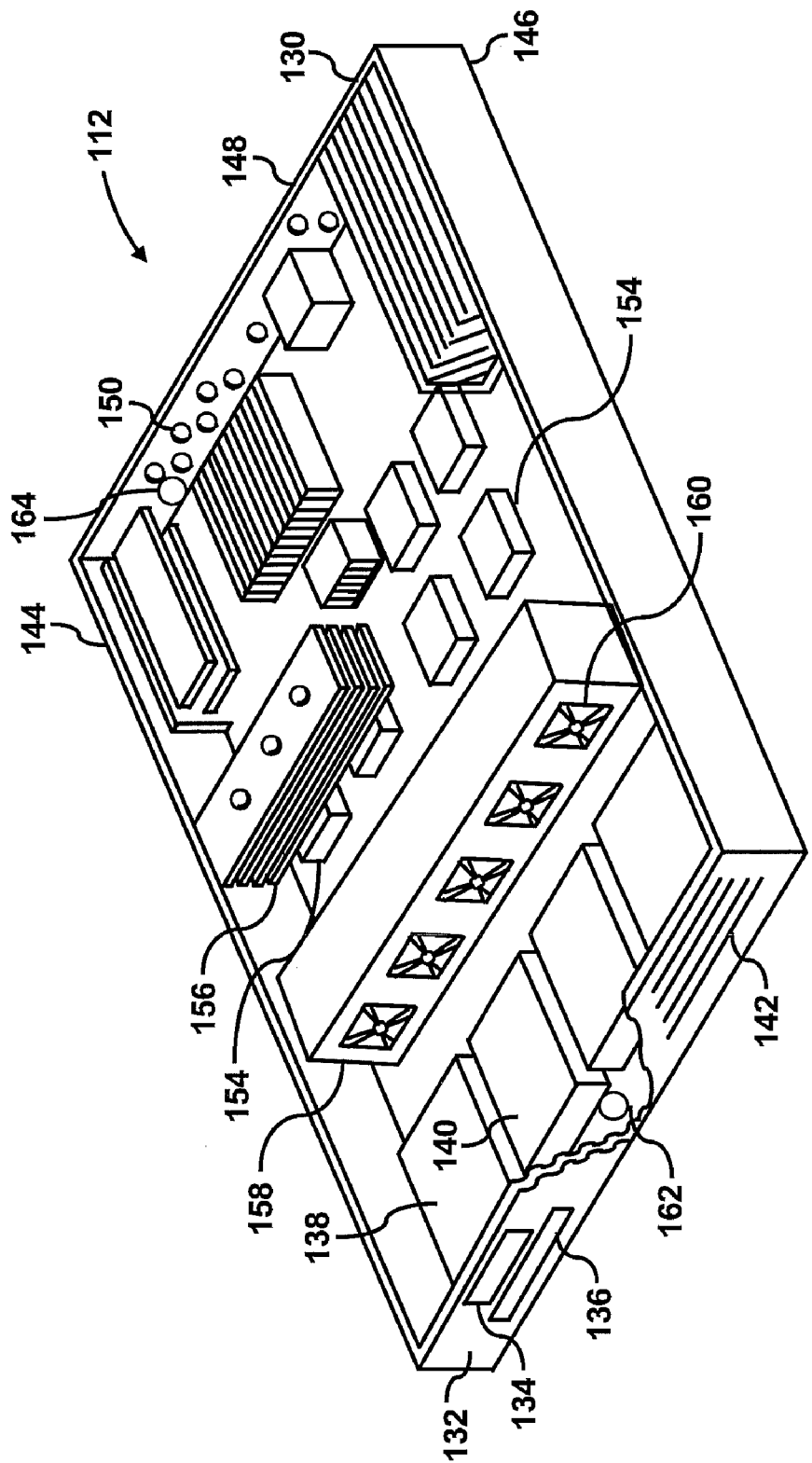
FIG. 1B is a perspective view of a conventional component that may be housed in the racks depicted in FIG. 1A.

FIG. 1B is a perspective view of a component 112, depicted here as a server, that may be housed in the racks 102-108 depicted in FIG. 1A. The component 112 may comprise a server that is configured for substantially horizontal mounting in a rack 102-108 or a server that is configured for substantially vertical mounting in a rack 102, 108, such as, a blade system. In any regard, the component 112 will be considered as a server throughout the remainder of the present disclosure. In addition, it should be understood that the server 112 depicted in FIG. 1B represents a generalized illustration and, therefore, other devices and design features may be added or existing devices or design features may be removed, modified, or rearranged without departing from the scope of the server 112. For example, the server 112 may include various openings for venting air through an interior of the server 112. As another example, the various devices shown in the server 112 may be re-positioned, removed, or changed.

As shown in FIG. 1B, the server 112 includes a housing 130 with a top section of the housing 130 removed for purposes of illustration. In addition, a part of a front section 132 of the housing 130 has been cut-away to more clearly show some of the devices contained in the server 112. The front section 132 is illustrated as containing various features to enable access to various devices contained in the server 112. For instance, the front section 132 is shown as including openings 134 and 136 for insertion of various media, for example, diskettes, flash memory cards, CD-Roms, etc. Located substantially directly behind the openings 134 and 136 are data storage devices 138 and 140 configured to read and/or write onto the various media. The front section 132 also includes vents 142 for enabling airflow into an interior of the housing 130.

The housing 130 also includes a plurality of side sections 144 and 146 and a rear section 148. The rear section 148 includes openings 150 to generally enable airflow out of the housing 130. Although not clearly shown in FIG. 1B, the rear section 148 also includes openings for insertion of wires, cables, and the like, into the housing 130 for connection to various devices contained in the housing 130. In addition, some of the openings 150 in the rear section 148 may include devices to enable the interfacing of certain devices contained in the housing 130 with various other electronic devices.

Contained within the housing 130 are electronic components 154 which, during operation, generate heat (hereinafter referred to as "heat-generating devices"). The heat-generating devices 154 may comprise microprocessors, power converters, memory controllers, power supplies, disk drives, etc. In addition, some of the heat-generating devices 154 may include heat sinks 156 configured to dissipate relatively larger amounts of heat generated by these devices 154 by providing a relatively larger surface area from which heat may be dissipated through convection.

Also illustrated in the server 112 is an optional fan cell 158. The fan cell 158 is considered optional because the additional airflow produced through use of the fan cell 158 may not be required in certain servers 112. In any regard, the optional fan cell 158 is depicted as being composed of fans 160 for blowing air through the server 112. The optional fan cell 158 is depicted as containing five fans 160 for illustrative purposes only and may therefore contain any reasonably suitable number of fans, for instance, from 1 to 10 or more fans. The fans 160 contained in the fan cell 158 may comprise relatively low capacity fans or they may comprise high capacity fans that may be operated at low capacity levels. In addition, the fans may have sufficiently small dimensions to enable their placement in the housing 130 without, for instance, substantially interfering with the operations of other devices contained in the server 112. Moreover, the optional fan cell 158 may be positioned at locations in or around the server 112 without departing from a scope of the server 112.

The server 112 is also illustrated as including an inlet sensor 162 and an outlet sensor 164. The inlet sensor 162 may comprise a sensor configured to detect temperature of airflow supplied into the server 112. Likewise, the outlet sensor 164 may be configured to detect the temperature of the airflow exiting the server 112. In this regard, the sensors 162 and 164 may comprise any reasonably suitable temperature sensors, such as, a thermocouples, thermistors, thermometers, etc. In addition, the sensors 162 and 164 may be integrally manufactured with the server 112 or the sensors 162 and 164 may be installed in the server 112 as an after-market device.

As will be described in greater detail below, the temperature measurements obtained through use of the inlet temperature sensor 162 and the outlet temperature sensor 164 may be transmitted to the resource manager 120 for use in creating a repository of data center 100 behavior profiles. The resource manager 120 may access the repository to compare an input profile with the information contained in the repository to select workload distribution schemes amongst the various servers 112 that substantially minimizes the total amount of power required to maintain the servers 112 within a predetermined temperature range. Initially, however, a system depicting an environment in which the various workload distribution methods may be implemented is discussed with respect to FIG. 2A.

Figure 2A:
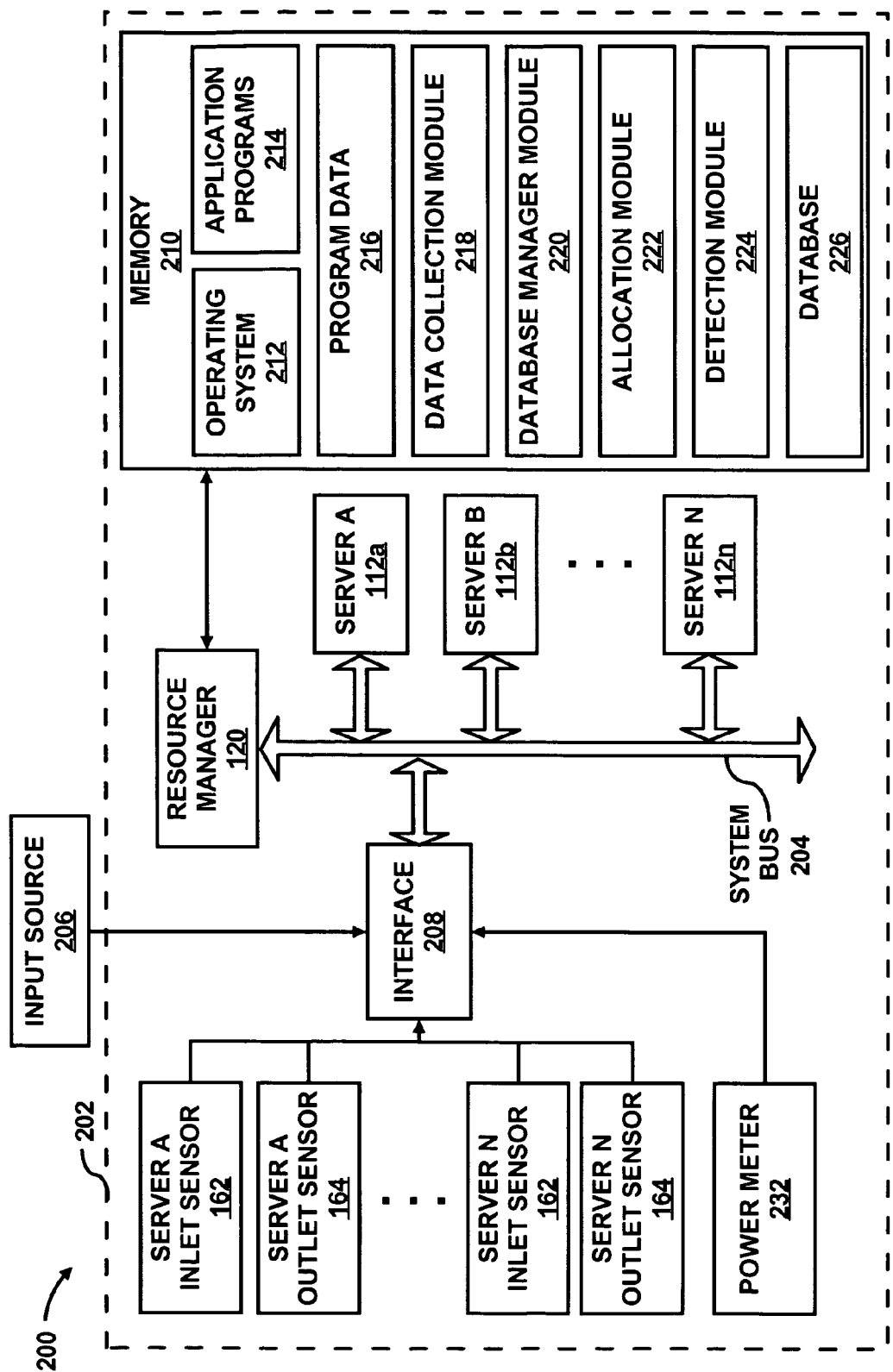
FIG. 2A is a block diagram of a workload distribution system according to an embodiment of the invention.

More particularly, FIG. 2A is a block diagram 200 of a workload distribution system 202 that may implement the workload distribution methods described below. It should be understood that the following description of the block diagram 200 is but one manner of a variety of different manners in which such a workload distribution system 202 may be configured. In addition, it should be understood that the workload distribution system 202 may include additional components and that some of the components described herein may be removed and/or modified without departing from the scope of the workload distribution system 202. For instance, the workload distribution system 202 may include any number of sensors, servers, power meters, etc., as well as other components, which may be implemented in the operations of the workload distribution system 202.

As shown, the workload distribution system 202 may comprise a general computing environment and includes the resource manager 120 depicted in FIG. 1A. As described herein above, the resource manager 120 is configured to perform various functions in the data center 100. In this regard, the resource manager 120 may comprise a computing device, for instance, a computer system, a server, etc. In addition, the resource manager 120 may comprise a microprocessor, a micro-controller, an application specific integrated circuit (ASIC), and the like, configured to perform various processing functions. In one respect, the resource manager 120 may comprise a controller of another computing device. Alternatively, the resource manager 120 may comprise software operating in a computing device.

Data may be transmitted to various components of the workload distribution system 202 over a system bus 204 that operates to couple the various components of the workload distribution system 202. The system bus 204 represents any of several types of bus structures, including, for instance, a memory bus, a memory controller, a peripheral bus, an accelerated graphics port, a processor bus using any of a variety of bus architectures, and the like.

An input source 206 may be employed to input information into the workload distribution system 202. The input source 206 may comprise, for instance, one or more computing devices connected over an internal network or an external network, such as, the Internet. The input source 206 may also comprise one or more peripheral devices, such as, a disk drive, removable media, flash drives, a keyboard, a mouse, and the like. In any regard, the input source 206 may be used, for instance, as a means to request that a workload or application be performed by some of the servers 112 in the data center 100. By way of example, a request to perform a multimedia application may be received into the workload distribution system 202 from or through an input source 206.

The input source 206 may input the workload request in the form of the workload to be performed and a prediction of resource utilization in performing the requested workload, collectively referred to herein as the requested workload profile. Input of the requested workload profile may include, for instance, information pertaining to the number of servers required to perform the workload, the amount of time the servers will be required to operate to perform the workload, etc. Input of the prediction of resource utilization may include information pertaining to a prediction of one or more of the CPU utilization, the memory utilization, the network utilization, and the storage utilization associated with the requested workload. In addition, input of the requested workload profile may include information related to a prediction of power consumed by the data center 100 in performing the requested workload. The information pertaining to the power consumption prediction may alternatively comprise information pertaining to a prediction of the amount of power consumed by the CRAC units 110 in maintaining the servers 112 within predetermined temperature ranges.

The information pertaining to the predicted resource utilization may be generated based upon knowledge of the types of workload requested and past resource utilization. In this regard, an algorithm that determines the types of workload requested and the past resource utilizations corresponding to those types of workload requests may be employed to generate the predicted resource utilization.

The resource manager 120 may communicate with the input source 206 via an Ethernet-type connection or through a wired protocol, such as IEEE 802.3, etc., or wireless protocols, such as IEEE 802.11b, 802.1 µg, wireless serial connection, Bluetooth, etc., or combinations thereof. In addition, the input source 206 may be connected to the resource manager 120 through an interface 208 that is coupled to the system bus 204. The input source 206 may, however, be coupled by other conventional interface and bus structures, such as, parallel ports, USB ports, etc.

The resource manager 120 may be connected to a memory 210 through the system bus 204. Alternatively, the resource manager 120 may be connected to the memory 210 through a memory bus, as shown in FIG. 2A. Generally speaking, the memory 210 may be configured to provide storage of software, algorithms, and the like, that provide the functionality of the workload distribution system 202. By way of example, the memory 210 may store an operating system 212, application programs 214, program data 216, and the like. The memory 210 may be implemented as a combination of volatile and non-volatile memory, such as DRAM, EEPROM, MRAM, flash memory, and the like. In addition, or alternatively, the memory 210 may comprise a device configured to read from and write to a removable media, such as, a floppy disk, a CD-ROM, a DVD-ROM, or other optical or magnetic media.

The memory 210 may also store modules programmed to perform various workload distribution functions. More particularly, the memory 210 may store a data collection module 218, a database manager module 220, a workload allocation module 222, and a detection module 224. The resource manager 120 may implement one or more of the modules 218-224 to perform some or all of the steps involved in the workload allocation methods described herein below.

Also stored in the memory 210 is a database 226 configured to store a repository of information pertaining to historical data center 100 behavior at various resource utilization levels. The repository of information, for instance, may include the entries contained in the table 300 depicted in FIG. 3. The table 300 and the entries contained therein provide an example of a possible arrangement of entries. As such, it should be understood that the table 300 may include additional entries and that some of the entries depicted therein may be removed and/or modified without departing from a scope of the table 300.

In general, each row in the table 300 represents a snapshot of a thermal map of the data center 100 correlated to a snapshot of the resource utilization levels at a given moment in time. The table 300 also provides the associated power levels for each particular snapshot or given moment in time. The power levels may pertain to the total level of power used to operate the servers 112, the CRAC units 110, and other resources at each particular snapshot. Alternatively, the power levels may pertain to the level of power used to operate the CRAC units 110 at each particular snapshot.

The table 300 provides a means by which the power levels for the profiles of a number of workload allocations, workload types, and resource utilizations, collectively referred to herein as a "historical workload profile", may relatively easily be correlated. In one regard, the table 300 stored in the database 226 may be employed to allocate workload based upon the historical workload profile that correlates to the lowest power level, and hence, the lowest costs, based upon the type of requested workload profile.

Figure 3:
FIG. 3 depicts a table illustrating an example of a repository format that may be employed to store historical workload profiles, according to an embodiment of the invention.

As shown in FIG. 3, the table 300 includes an entry entitled "Server Location" and an entry entitled "Workload Type". The first entry identifies the locations of the servers 112 and the second entry identifies the types of workloads placed on the respective servers 112. The third entry is entitled "Server Class" and may be used to track changes to the servers at the server locations due to, for instance, upgrades, replacements, etc. In one respect, the changes may be tracked because the interpretations of the entries that are captured in the history may also be changed. When changes to the servers occur, one option is to discard all the entries that correspond to the previous system, while another option is to scale the utilization, etc., values so as to obtain some first-order estimates of the profile of a given application running on the new system. For instance, CPU utilization may be scaled by the effective throughput of the new system over the old one, while memory and network utilizations may be assumed to remain constant. In addition, or alternatively, power consumption may be scaled by the ratio "typical worst case consumption of new server/typical worst case power consumption of old server."

The next four entries indicate various resource utilizations corresponding to the types of workloads and the servers 112 at which the workloads were allocated. The next two entries identify the inlet and outlet temperatures, respectively, of the servers 112. The final entry indicates the power level for each particular set of entries.

Referring back to FIG. 2A, the resource manager 120 may implement the data collection module 218 to populate the entries contained in the table 300. In addition, the resource manager 120 may implement the data collection module 218 to generate a statistically significant number of entries in the table 300. In a first example, the resource manager 120 may implement the data collection module 218 to collect data to be entered into the table 300 periodically and for a relatively long period of time to generate the statistically significant number of entries. For instance, the resource manager 120 may implement the data collection module 218 to obtain the snapshots at relatively short intervals, for instance, every 1-10 or more minutes, for a relatively long period of time, for instance, 1-6 or more months. In this regard, for instance, the statistically significant number of entries may be defined to include a relatively wide range of differing conditions.

In a second example, in addition, or alternatively, to the first example, the implementation of the data collection module 218 to collect data at a particular time may be triggered by a statistically significant event. The statistically significant event may include, for instance, when a new workload placement allocation is detected, when a significant change in resource allocation is detected, when a power level value varies beyond a predetermined range, when operations of the CRAC units 110 varies beyond a predetermined range, etc.

In a third example, in addition, or alternatively to the first example, the resource manager 120 may implement the data collection module 218 to collect data during random periods of the day for a relatively long period of time, such as 1-3 or more months.

In a fourth example, in addition, or alternatively to the first, second, and third examples, the resource manager 120 may perform structured experiments and implement the data collection module 218 to collect data based upon the structured experiments. The structured experiments may include, for instance, a relatively wide range of varying workload allocations, workload types, and resource utilizations, and therefore the inlet and outlet temperatures of the servers 112a-112n. Thus, for instance, the resource manager 120 may implement the data collection module 218 to collect data at the various settings of the structured experiments to, in one regard, to substantially ensure that the table 300 includes a relative wide coverage of possible conditions.

In any of the examples above, for each particular snapshot, the resource manager 120 may implement the data collection module 218 to populate the table 300 with information obtained from suitable sources. For instance, the locations of the servers 112a-112n may be put into the table 300 of the database 226 manually. Alternatively, the server 112a-112n locations may automatically be detected and tracked in situations where the data center 100 is equipped to detect and track the locations of the servers 112a-112n.

Information pertaining to the workload type performed in the servers 112a-112n may be obtained by the resource manager 120, for instance, when the workload was allocated to the servers 112a-112n. In addition, the resource utilizations of the servers 112a-112n may be tracked, through use of, for instance, tracking utilization tracking software stored in the data collection module 218. The resource utilizations, for instance, CPU utilization, memory utilization, network utilization, and storage utilization, may also be tracked through use of any reasonably suitable device for tracking the resource utilizations (not shown).

The inlet and outlet temperatures of the servers 112a-112n may respectively be obtained from the inlet temperature sensors 162 and the outlet temperatures 164, which are also shown in FIG. 1B. As shown, the "N" denoting the sever sensors A-N 162 and 164 and the "n" denoting the servers A-N 112a-112n, indicate non-negative integers. In addition, the ellipses between server A outlet sensor 164 and the server inlet sensor 162 generally indicate that the workload distribution system 202 may include any reasonably suitable number of sensors. Moreover, the ellipses between the server 112b and server 112n generally indicate that the resource manager 120 may allocate workload to any reasonably suitable number of servers 112.

In a first example, the temperature measurements obtained from the respective inlet temperature sensors 162 and the respective outlet temperature sensors 164 may be employed to determine the power level used by the CRAC units 110 at the particular snapshot. The total heat (Q) dissipated by the servers 112a-112n at the particular snapshot may be determined through the following equation:

Equation (1):

$$Q = \sum_{i=1}^{n} C_p \cdot m_i \cdot (T_i^{out} - T_i^{in}).$$

In Equation (1), n is the number of servers 112a-112n in the data center 100, $C_p$ is the specific heat of air, $m_i$ is the mass flow of air through server i, which may be in kg/sec, $T_i^{in}$ is the inlet temperature for server i, and $T_i^{out}$ is the outlet temperature for the server i. The level of power consumed by the CRAC units 110 in maintaining the temperatures of the servers 112a-112n within a predetermined temperature range is a function of the total heat (Q) dissipated by the servers 112a-112n. More particularly, as the total heat (Q) increases, so does the level of power consumed by the CRAC units 110. Alternatively, as the total heat (Q) decreases, so does the level of power consumed by the CRAC units 110 as the energy required to cool the servers 112a-112n has also decreased.

In a second example, the power consumption levels of the CRAC units 112a-112n may be measured directly through use of an optional power meter 232. The power meter 232 may comprise any reasonably suitable power meter 232 capable of tracking the power usage of the CRAC units 110. In the event that a power meter 232 is employed to track the power levels of the CRAC units 110, the temperatures at the inlets and the outlets of the servers 112a-112n need not be tracked.

In either of the examples above, data collected by either the sensors 162 and 164 or the power meter 232 may be communicated to the resource manager 120 through the interface 208. In this regard, the interface 208 may comprise at least one of hardware and software configured to enable such data transfer. In addition, this data may be used to populate one or more of the entries of the table 300 stored in the database 226. Moreover, proxy-based models may be used for any of the parameters in the table 300. In other words, for instance, approximate power levels may be used if power meters 232 are not used.

The resource manager 120 may implement the database manager module 220 to perform various operations on the information contained in the database 226. For instance, the database manager module 220 may be implemented to define equivalence classes that identify server locations that are "equivalent" from the point of view of performance and thermal profiling.

The database manager module 220 may also be implemented to perform a search through the repository of information, or the table 300, pertaining to historical data center 100 behavior at various resource utilizations stored in the database 226. The database manager module 220 may be implemented to perform a search in response to receipt of the requested workload profile from an input source 206. The requested workload profile may include a list including the types of workloads to be performed as well as a prediction of the resource utilization required to perform the types of workloads. The predicted resource utilization may be based upon knowledge of the types of workload requested and past resource utilization, which may also be stored in the database 226.

The database manager module 220 may also be configured to match the requested workload and predicted resource utilization to the entries contained in the repository of information, or the table 300. In seeking matches between the requested workload profile and tuples of historical workload profiles contained in the table 300, the database manager module 220 may perform a recursive search through the table 300 to determine the best match to substantially optimize the thermal profile in the data center 100 and thereby minimize the amount of power required to cool the servers 112a-112n. Any reasonably suitable known recursive search algorithm may be implemented to locate the closest match. In addition, bin packing algorithms may be used to simplify some of the matching decisions. Moreover, the matching decisions may be further simplified by defining equivalence classes that identify server locations that are "equivalent" from the point of view of performance and thermal profiling.

The database manager module 220 may rank the closeness of any matches between the requested workload profile and the historical workload profiles. For instance, an entry that matches four CPU utilizations of 100%, 100%, 100%, and 100% has a higher closeness ranking than an entry that matches four CPU utilizations of 80%, 80%, 90%, and 100%. Based upon the closeness ranking, and the estimated power benefits, the database manager module 220 may select one of the historical workload profiles or entries in the table 300. In one example, the database manager module 220 may use models to extrapolate the substantially optimized workload distribution profile in cases where the closeness rankings do not exceed a particular threshold. In addition, the selection of the substantially optimized workload distribution profile may be performed automatically by the database manager module 220 or it may be initiated with manual intervention and may be guided by user hints or application hints.

The resource manager 120 may implement the allocation module 222 to allocate workload in the amounts and to the servers 112a-112n according to the historical workload profile selected through implementation of the database manager module 220. The resource manager 120 may also implement the detection module 224 to determine, in general, whether the workload allocation performed through implementation of the allocation module 222 resulted in the desired power usage level. In addition, the resource manager 120 may implement the modules 220 and 222 to re-allocate the workload if the prior workload allocation did not result in the desired power usage level.

Various manners in which the workload allocations to the servers 112a-112n may be determined and in certain instances, implemented, are described in greater detail herein below with respect to the FIGS. 4A and 4B.

Figure 2B:
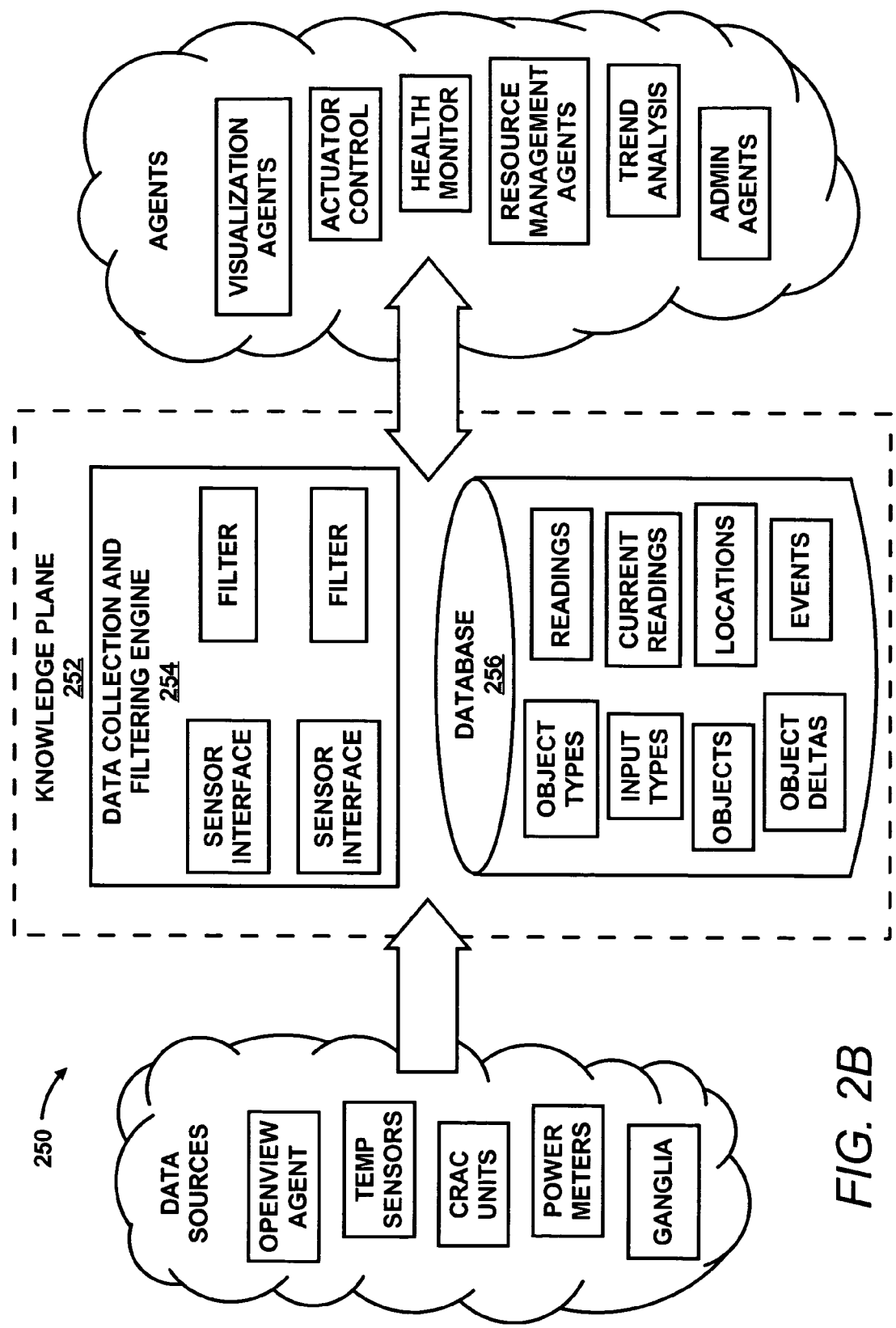
FIG. 2B is a block diagram of a data collection scheme usable in the workload distribution system depicted in FIG. 2A, according to an embodiment of the invention.

However, reference is made first to FIG. 2B, which depicts a data collection schema 250, according to an example. Generally speaking, the data collection schema 250 includes the data sources, which may include the various sensors 162, 164 and power meters 232 depicted in FIG. 2A. The data collection schema 250 also includes a knowledge plane 252, which may form part of the database 226 in FIG. 2A, and a plurality of various agents. As such, the data collection schema 250 generally represents one possible way that the database 226 may be organized.

As shown in FIG. 2B, the database 226 may include a data collection and filtering engine 254 and a database 256, which are generally configured to perform various functions as identified by their names. In addition, the database 256 may include multiple tables, including tables that capture such as, object types, input types, object events, etc. In this regard, the database 226 may comprise a relatively powerful tool configured to collect and filter various data related to historical workload profiles.

Figure 4A:
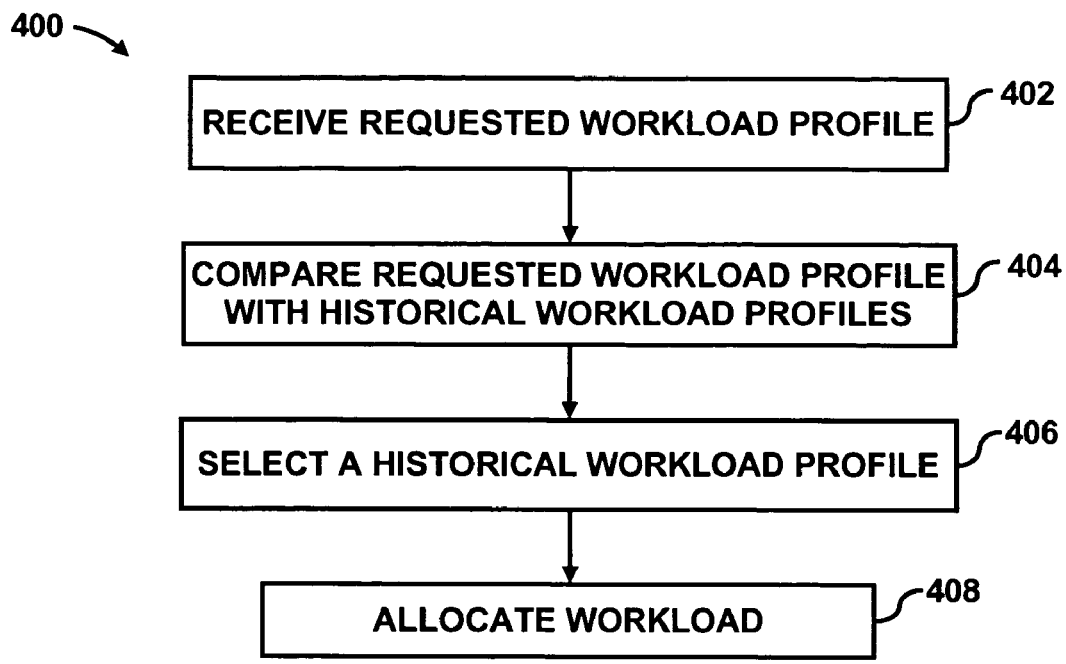
FIG. 4A illustrates a flow diagram of a method for allocating workload among servers based upon historical data to substantially minimize power usage, according to an embodiment of the invention.

With reference now to FIG. 4A, there is shown a flow diagram of a method 400 for allocating workload among servers based upon historical data to substantially minimize power usage, according to an example. It is to be understood that the following description of the method 400 is but one manner of a variety of different manners in which an embodiment of the invention may be practiced. It should also be apparent to those of ordinary skill in the art that the method 400 represents a generalized illustration and that other steps may be added or existing steps may be removed, modified or rearranged without departing from a scope of the method 400.

The description of the method 400 is made with reference to the block diagram 200 illustrated in FIG. 2A, and thus makes reference to the elements cited therein. It should, however, be understood that the method 400 is not limited to the elements set forth in the block diagram 200. Instead, it should be understood that the method 400 may be practiced by a workload distribution system having a different configuration than that set forth in the block diagram 200.

At step 402, the workload distribution system 202 may receive a requested workload profile. The requested workload profile may be compared with a plurality of historical workload profiles at step 404. In addition, a historical workload profile that is within a predefined range of the requested workload profile and that corresponds to a substantially minimized power usage level may be selected at step 406. Moreover, the requested workload of the requested workload profile may be allocated among the servers 112a-112n according to the selected historical workload profile at step 408, to thereby substantially minimize power usage in performing the requested workload.

The steps outlined in the method 400 are described in greater detail herein below with respect to FIG. 4B. In addition, FIG. 4B describes additional steps that may be performed in conjunction with the steps outlined in the method 400.

Figure 4B:
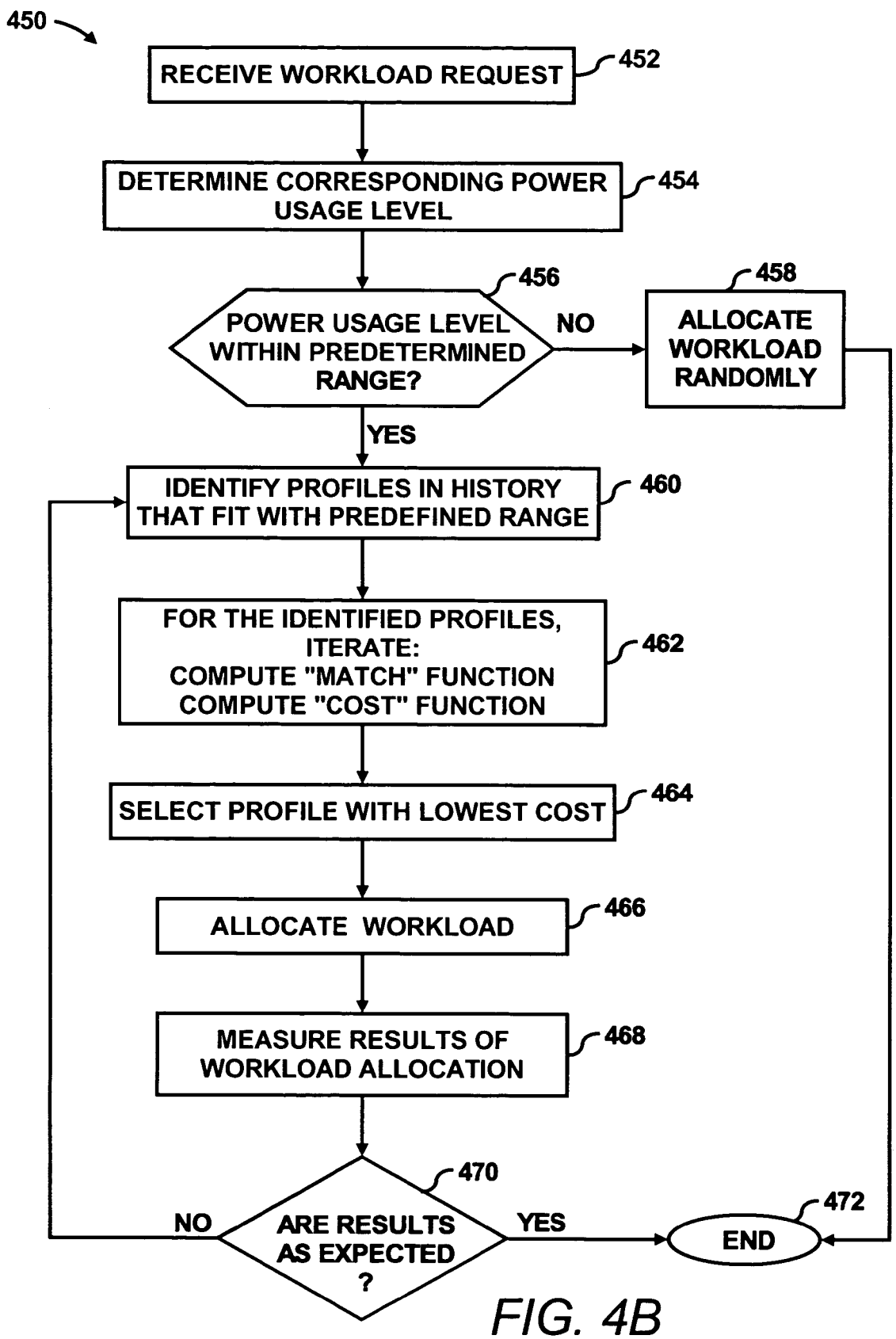
FIG. 4B illustrates a flow diagram of a method similar to the method depicted in FIG. 4A, according to an embodiment of the invention.

With reference now to FIG. 4B, there is shown a flow diagram of a method 450 for allocating workload among servers based upon historical data to substantially minimize power usage. It is to be understood that the following description of the method 450 is but one manner of a variety of different manners in which an embodiment of the invention may be practiced. It should also be apparent to those of ordinary skill in the art that the method 450 represents a generalized illustration and that other steps may be added or existing steps may be removed, modified or rearranged without departing from a scope of the method 450.

The description of the method 450 is made with reference to the block diagram 200 illustrated in FIG. 2A, and thus makes reference to the elements cited therein. It should, however, be understood that the method 450 is not limited to the elements set forth in the block diagram 200. Instead, it should be understood that the method 450 may be practiced by a workload allocation system having a different configuration than that set forth in the block diagram 200.

The method 450 may be performed to substantially minimize the total power consumed in the data center 100 in operating and maintaining the servers 112a-112n within predetermined temperature ranges. More particularly, the method 450 may be implemented to allocate workload among the servers 112a-112n based upon the power usage levels of historical workload distribution profiles. In addition, the method 450 may include allocation of workload to the servers 112a-112n based upon the determined workload allocation scheme.

The method 450 may be initiated through receipt of a workload request by the resource manager 120 or be triggered by significant changes in behavior of the existing workload at step 452. In addition or alternatively, the method 450 may be manually initiated, initiated according to an operating schedule, etc. In any regard, the workload request received at step 452 may include a requested workload profile, which includes the types of workloads to be performed as well as the predicted resource utilizations. The requested workload profile may also include a predicted power usage level that corresponds to the types of workloads and the predicted resource utilizations. The predicted power usage level may also, or alternatively, correspond to the power usage level for the thermal profile associated with the requested workload profile.

In either respect, if the requested workload profile does not include the predicted power usage level, the power usage level, either the total power usage level or the power usage level for the thermal profile associated with the requested workload profile, corresponding to the requested workload profile may be determined at step 454. This correlation may be determined through, for instance, the various correlations between the requested workload profile and the power usage levels contained in the table 300. Alternatively, this correlation may be determined through other suitable manners of correlating the requested workload profile and power usage levels.

At step 456, the resource manager 120 may determine whether the predicted power usage level is within a predetermined range of power usage levels, to thereby filter out workload requests that are outside of the range contained in the repository of prior data center 100 behavior. The predetermined range of power usage levels may comprise the range of power usage levels contained in the table 300. Thus, for instance, if the predicted power usage level is 500 Watts, and the predetermined range of power usage levels in the table 300 is between 1000-10000 Watts, the predicted power usage level is considered as being outside of the predetermined range of power usage levels. In this case, which equates to a "no" condition at step 456, the resource manager 120 may randomly allocate the requested workload as indicated at step 458. The random allocation of the workload may alternatively comprise allocation of the workload according to standard workload allocation techniques. In addition, following allocation of the workload at step 458, the method 450 may end as indicated at step 472.

However, if the predicted power usage level is within the predetermined range of power usage levels, which equates to a "yes" condition at step 456, the resource manager 120 may identify the historical workload profiles that are within a predefined range with respect to the requested workload profile at step 460. More particularly, for instance, the resource manager 120 may determine which of the entries (historical workload profiles) contained in the table 300 are within a predefined range of the requested workload profile. The predefined range, in this case, may depend upon the level of computational power used in matching the requested workload profile to a historical workload profile. Thus, the larger the predefined range, the greater the computational power required to compare the requested workload profile with the historical workload profiles. In addition, or alternatively, at step 460, the resource manager 120 may optionally use extrapolation models to identify the a historical workload profile that fit within the predefined range.

At step 462, for the historical workload profiles that are within the predefined range, a "match" function and a "cost" function may be iterated. More particularly, for instance, the resource manager 120 may compute how closely each of the identified historical workload profiles matches the requested workload profile. In addition, the resource manager 120 may compute the costs associated with each of the historical workload profiles. The costs may equate to the power consumption levels corresponding to each of the historical workload profiles.

At step 464, the resource manager 120 may select the historical workload profile that corresponds to the lowest power consumption level and thus the lowest cost. In addition, at step 466, the resource manager 120 may allocate the workload according to the historical workload profile selected at step 464. More particularly, the resource manager 120 may allocate the requested workload to the servers 112a-112n in the manner indicated by the historical workload profile. As such, the workload may be placed on the servers 112a-112n in an arrangement configured to result in the substantial minimization of the power consumption used to maintain the servers 112a-112n within predetermined temperature ranges.

The manner in which workload is allocated among the servers 112a-112n may depend upon the timing at which the workload is allocated. For instance, if the workload is to be allocated at a time when the servers 112a-112n are idle, the workload may simply be allocated to the servers 112a-112n in the selected allocations. However, if one or more of the servers 112a-112n are in an operational state at the time the workload is to be placed, techniques such as virtual machines, for instance, VMWARE, XEN, etc., process migration, for instance, ZAP, etc., service migration, or request redirection, for instance, TCP handoff, LINUX virtual server, etc., may be employed to direct the workloads to the selected servers 112a-112n.

In any respect, following allocation and placement of the workload among the servers 112a-112n, the method 450 may include an optional monitoring step to substantially ensure that the workload placement resulted in the expected power usage level. In this regard, at step 468, the resource manager 120 may measure the results of the workload allocation performed at step 466. More particularly, the resource manager 120 may determine the actual power usage level following step 466. The actual power usage level may be determined through use of the power meter 232 or through a correlation of power usage and heat dissipation by the servers 112a-112n as described above.

At step 470, the resource manager 120 may compare the results of the workload allocation with expected results. More particularly, the resource manager 120 may determine whether the actual power usage level equals or is within a predefined range of the predicted power usage level. The predefined range of the predicted power usage level may be defined according to the desired level of accuracy. Thus, for instance, the predefined range may be set to a smaller range of power usage levels if a greater level of accuracy is desired. If the results are not as expected or the actual power usage level is outside of the predefined range, steps 460-466 may be repeated to re-allocate the workload. In addition, the historical workload profile selected in the previous iteration of step 460 may be removed from consideration in the current iteration of step 460.

However, if the results are as expected or within the predefined range, the method 450 may end as indicated at step 472. Step 472 may comprise an idle state for the resource manager 120 because the resource manager 120 may be configured to perform the method 450 upon receipt of another workload request. In this regard, the method 450 may be performed as additional workload requests are received by the workload distribution system 202.

Figure 5:
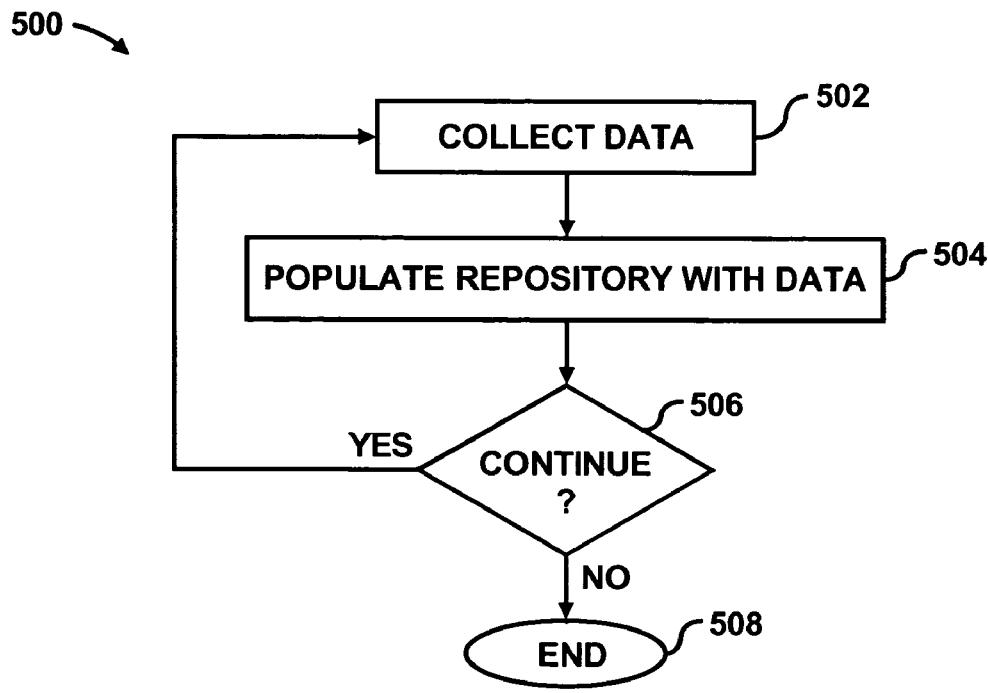
FIG. 5 illustrates a flow diagram of a method for creating a repository of prior data center behavior that may be employed in the methods depicted in FIGS. 4A and 4B, according to an embodiment of the invention.

With reference now to FIG. 5, there is shown a flow diagram of a method 500 for creating a repository of prior data center 100 behavior. The method 500 may be performed to create the historical workload profiles, for instance, in the form of the table 300 depicted in FIG. 3. In this regard, the method 500 may be performed prior to either of the methods 400 and 450. In addition, the resource manager 120 may employ the repository created through implementation of the method 500 in performing steps 460-464 in FIG. 4B.

At step 502, data may be collected for inclusion in the repository from various sources as described above with respect to data collection module 218 in FIG. 2A. In one example, the data may be collected at various times and for a relatively long period of time to substantially ensure that a statistically significant number of data sets are collected for the repository. In a second example, in addition or alternatively, to the first example, the data collection at step 502 may be performed in response to a statistically significant event. In a third example, in addition or alternatively, to the first and second examples, a number of structured experiments may be performed to thus create a relatively wide range of historical workload profiles.

The data collected through any of the examples above may be inserted into the repository at step 504. The collected data may be used to populate entries in the repository, such that, the collected data may, for instance, be stored in the form of the table 300 depicted in FIG. 3.

At step 506, it may be determined as to whether the method 500 is to continue. The method 500 may be continued, for instance, for a length of time to generally ensure that a statistically significant amount of data is collected and entered into the repository. If it is determined that the method 500 is to continue, steps 502-506 may be repeated until it is determined that the method 500 is to discontinue. In this case, the method 500 may end as indicated at step 508.

The operations set forth in the methods 400, 450, and 500 may be contained as a utility, program, or subprogram, in any desired computer accessible medium. In addition, the methods 400, 450, and 500 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices in compressed or uncompressed form.

Exemplary computer readable storage devices include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 6:
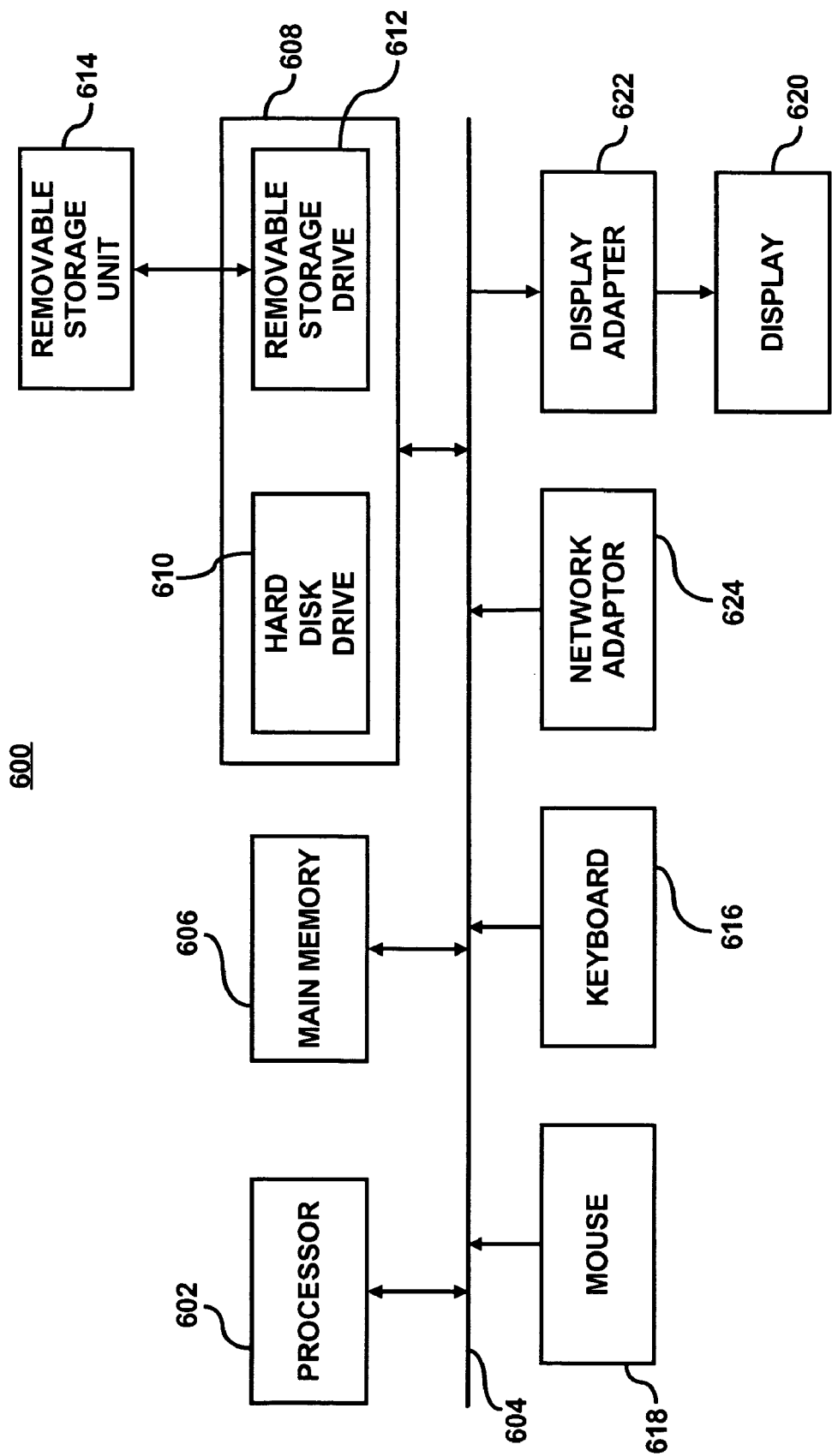
FIG. 6 illustrates a computer system, which may be employed to perform the various functions of the workload distribution system, according to an embodiment of the invention.

FIG. 6 illustrates a computer system 600, which may be employed to perform the various functions of the resource manager 120 described hereinabove, according to an embodiment. In this respect, the computer system 600 may be used as a platform for executing one or more of the functions described hereinabove with respect to the resource manager 120.

The computer system 600 includes one or more controllers, such as a processor 602. The processor 602 may be used to execute some or all of the steps described in the methods 400, 450, and 500. Commands and data from the processor 602 are communicated over a communication bus 604. The computer system 600 also includes a main memory 606, such as a random access memory (RAM), where the program code for, for instance, the resource manager 120, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the workload distribution system 202 may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein are embodiments of the invention along with some of their variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of allocating workload among servers based upon historical data, said method comprising steps performed by a processor of:
    receiving a requested workload profile, wherein the requested workload profile comprises data pertaining to workload to be performed and a prediction of resource utilization in performing the requested workload;
    comparing the requested workload profile with a plurality of historical workload profiles, wherein the plurality of historical workload profiles comprise profiles of a number of workload allocations, workload types, and resource utilizations associated with the workload allocations and workload types;
    selecting a historical workload profile that is within a predefined range of the requested workload profile and that corresponds to a minimized resource usage for power and cooling; and
    allocating workload among the servers according to the selected historical workload profile to thereby minimize resource usage for power and cooling.

2. The method according to claim 1, wherein the power usage levels of each of the historical workload profiles corresponds to a cost function, and wherein the step of selecting a historical workload profile further comprises selecting a historical workload profile with the lowest cost function.

3. The method according to claim 1, wherein the step of selecting a historical workload profile further comprises selecting a historical workload profile that corresponds to a minimized resource usage for power and cooling for the servers.

4. The method according to claim 1, further comprising steps performed by a processor of:
    measuring results of the workload allocation in response to the allocation of workload among the servers; and
    determining whether the results of the workload allocation are within a predefined range of expected results.

5. The method according to claim 4, further comprising steps performed by a processor of:
    removing the selected historical workload profile from consideration in response to the results of the workload allocation falling outside of the predefined range of expected results;
    identifying at least one another historical workload profile that is within a predefined range of the requested workload profile;
    selecting one of the at least one another historical workload profile; and
    allocating workload among the servers according to the selected one of the at least one another historical workload profile.

6. The method according to claim 5, wherein the power usage levels of each of the historical workload profiles corresponds to a cost function, and wherein the step of selecting one of the at least one another historical workload profile further comprises selecting the historical workload profile with the lowest cost function.

7. The method according to claim 1, further comprising steps performed by a processor of:
creating a repository containing the plurality of historical workload profiles; and
wherein the step of comparing the requested workload profile with a plurality of historical workload profiles further comprises comparing the requested workload profile with the plurality of historical workload profiles contained in the repository.

8. The method according to claim 7, wherein the step of creating a repository further comprises:
collecting a predetermined amount of data; and
populating the repository with the collected data, wherein the predetermined amount of data includes a relatively wide range of differing historical workload profiles.

9. The method according to claim 7, wherein the step of creating the repository further comprises:
collecting server utilization and thermal profile data periodically;
determining power usage levels based upon the thermal profile data; and
storing the collected server utilization and thermal profile data and the determined power usage levels to create the repository.

10. The method according to claim 7, wherein the step of creating the repository further comprises:
conducting a structured experiment that covers a predetermined range of server utilization and thermal profiles to thereby define a predetermined range of historical workload profiles;
determining power usage levels corresponding to the historical workload profiles based upon the structured experiment; and
storing the historical workload profiles to create the repository.

11. The method according to claim 1, further comprising steps performed by a processor of:
creating a repository containing the plurality of historical workload profiles; and
wherein the step of comparing the requested workload profile with a plurality of historical workload profiles further comprises extrapolating workload profiles from existing historical workload profiles.

12. The method according to claim 1, further comprising steps performed by a processor of:
determining a power usage level corresponding to the requested workload profile;
comparing the power usage level to a range of power usage levels corresponding to the historical workload profiles; and
randomly allocating the workload among the servers in response to the power usage level being outside of the range of power usage levels.

13. The method according to claim 12, further comprising steps performed by a processor of:
identifying the historical workload profiles that are within the range of power usage levels in response to the power usage level of the requested workload profile falling within the range of power usage levels; and
wherein the step of selecting a historical workload profile further comprises selecting a historical workload profile from the identified historical workload profiles.

14. A system for allocating workload among servers based upon historical data, said system comprising:
a database containing a repository of the historical data in a matrix of historical workload profiles, wherein the historical workload profiles comprise profiles of a number of workload allocations, workload types, and resource utilizations associated with the workload allocations and workload types;
a controller configured to search the repository to select a historical workload profile that is within a predefined range of a requested workload profile and that corresponds to a minimized power usage level, said controller being further configured to allocate the workload associated with the requested workload profile according to the selected historical workload profile to minimize resource usage for power and cooling in performing the workload, wherein the requested workload profile comprises data pertaining to workload to be performed and a prediction of resource utilization in performing the requested workload.

15. The system according to claim 14, wherein the repository stored in the database comprises a table listing a predetermined range of historical workload profiles and the power usage levels corresponding to each of the historical workload profiles.

16. The system according to claim 14, wherein the controller is further configured to collect a predetermined amount of data corresponding to the historical workload profiles and to populate the repository with the predetermined amount of data.

17. The system according to claim 14, wherein the controller is further configured to populate the repository with workload profiles extrapolated from existing historical workload profiles.

18. The system according to claim 14, wherein the controller is further configured to determine whether the allocated workload produced expected results and to re-allocate the workload if the allocated workload did not produce expected results.

19. The system according to claim 14, wherein the controller is further configured to select a historical workload profile that corresponds to a minimized resource usage for power and cooling for the servers.

20. A system for allocating workload among servers, said system comprising:
a data storage storing a repository of historical workload profiles, wherein the historical workload profiles comprise profiles of a number of workload allocations, workload types, and resource utilizations associated with the workload allocations and workload types; and
a processor configured to compare a requested workload profile with the historical workload profiles, wherein the requested workload profile comprises data pertaining to workload to be performed and a prediction of resource utilization in performing the requested workload,
wherein the processor is further configured to select a historical workload profile, and
to allocate workload among the servers based upon the historical workload profile selected by the processor.

21. The system according to claim 20,
wherein the processor is further configured to create the repository.

22. A computer readable storage medium on which is embedded one or more computer programs, said one or more computer programs implementing a method of allocating workload among servers based upon historical data, said one or more computer programs comprising a set of instructions for:

receiving a requested workload profile, wherein the requested workload profile comprises data pertaining to workload to be performed and a prediction of resource utilization in performing the requested workload;

comparing the requested workload profile with a plurality of historical workload profiles, wherein the plurality of historical workload profiles comprise profiles of a number of workload allocations, workload types, and resource utilizations associated with the workload allocations and workload types;

selecting a historical workload profile that is within a predefined range of the requested workload profile and that corresponds to a minimized power usage level in cooling the servers; and allocating workload among the servers according to the selected historical workload profile to thereby minimize resource usage for power and cooling for the servers.

* * * * *